United States Patent
Sahara et al.

(10) Patent No.: US 7,462,914 B2
(45) Date of Patent: Dec. 9, 2008

(54) SEMICONDUCTOR CIRCUIT DEVICE AND SIMULATION METHOD OF THE SAME

(75) Inventors: Yasuyuki Sahara, Kyoto (JP); Katsuhiro Ootani, Nara (JP)

(73) Assignee: Panasonic Corporation, Osaka (JP)

( * ) Notice: Subject to any disclaimer, the term of this patent is extended or adjusted under 35 U.S.C. 154(b) by 422 days.

(21) Appl. No.: 11/410,063

(22) Filed: Apr. 25, 2006

(65) Prior Publication Data
US 2007/0018209 A1    Jan. 25, 2007

(30) Foreign Application Priority Data
Jul. 21, 2005    (JP) .............................. 2005-211531

(51) Int. Cl.
H01L 29/78    (2006.01)
H01L 21/8238    (2006.01)
G06F 17/50    (2006.01)
(52) U.S. Cl. .......................................... 257/369; 716/2
(58) Field of Classification Search ................. 257/369; 716/2
See application file for complete search history.

(56) References Cited

U.S. PATENT DOCUMENTS 7,105,901 B1 * 9/2006 Miyanishi et al. ........... 257/401

2006/0006474 A1 * 1/2006 Tsuboi ........................ 257/369
2007/0228488 A1 * 10/2007 Kishii et al. ................. 257/374

FOREIGN PATENT DOCUMENTS

JP    2003-264242    9/2003

* cited by examiner

Primary Examiner—Evan Pert
(74) Attorney, Agent, or Firm—McDermott Will & Emery LLP

(57) ABSTRACT

A first PMIS transistor includes a first active region which is formed on a semiconductor substrate and a first gate electrode which is formed on the first active region and which is connected at one end thereof to a first gate wiring and includes at the other end thereof a first protruding portion protruding at a side opposite to the first gate wiring side from the first active region A first NMIS transistor includes a second active region which is formed on the semiconductor substrate with a space left from the first active region and a second gate electrode which is formed on the second active region and which is connected at one end thereof to the first gate wiring and includes at the other end thereof a second protruding portion protruding at a side opposite to the first gate wiring side from the second active region. A protruding length of the first protruding portion of the first PMIS transistor is greater than a protruding length of the second protruding portion of the first NMIS transistor.

12 Claims, 7 Drawing Sheets

```
MN1   Dn1   Gn1   Sn1   Bn1   NMOS   W=1.0u   L=0.15u   E=0.1u
MP1   Dp1   Gp1   Sp1   Bp1   PMOS   W=1.5u   L=0.15u   E=0.2u      ~70
MN2   Dn2   Gn2   Sn2   Bn2   NMOS   W=0.3u   L=0.15u   E=0.8u
MP2   Dp2   Gp2   Sp2   Bp2   PMOS   W=0.4u   L=0.15u   E=1.3u
 ⁝
```

```
MN1   Dn1   Gn1   Sn1   Bn1   NMOS   W=1.0u   L=0.1u
MP1   Dp1   Gp1   Sp1   Bp1   PMOS   W=1.5u   L=0.2u
MN2   Dn2   Gn2   Sn2   Bn2   NMOS   W=0.3u   L=0.8u
MP2   Dp2   Gp2   Sp2   Bp2   PMOS   W=0.4u   L=1.3u
⋮
```

SEMICONDUCTOR CIRCUIT DEVICE AND SIMULATION METHOD OF THE SAME

CROSS REFERENCE TO RELATED APPLICATIONS

This Non-provisional application claims priority under 35 U.S.C. § 119(a) on Patent Application No. 2005-211531 filed in Japan on Jul. 21, 2005, the entire contents of which are hereby incorporated by reference.

BACKGROUND ART

The present invention relates to a semiconductor circuit device of which transistor ability is enhanced by optimization of design layout and a simulation method thereof.

Recently, LSI (Large Scale Integrated) circuits typified by microprocessors are configured by combination of multiple unit circuits generally called cells and having a fundamental function. Meanwhile, in association with increases in performance and in integration of the LSI circuits, the importance of a role is increasing which CAD (Computer Aided Design) tools play in highly accurate circuit design of cells that form the basis of the LSI circuits.

As one of CAD tools on which layout accuracy largely depends, a circuit simulator is listed. The circuit simulator performs simulation on a designed cell or LSI circuit on the assumption of operation of an actually manufactured cell or LSI circuit on the basis of a netlist containing connection information on respective elements such as a MIS (metal insulator semiconductor) transistor, a capacitor, a resistor, and the like and characteristic information on each element, such as transistor size (transistor width and transistor length), capacitance, resistance, and the like.

The netlist is generated by extracting the characteristic information and the connection information of each arranged element, for example, from mask layout data of the designed cell by a layout parameter extractor (LPE).

For reproducing a complicated electric characteristic of a MIS transistor on such a circuit simulator at high accuracy, various kinds of electric characteristic formulae (hereinafter referred to as transistor models) are developed as characteristic information of the MIS transistor. In order to reproduce a desired transistor characteristic from a transistor model, it is necessary to optimize a model parameter included in the transistor model (hereinafter referred to as extraction of a model parameter) so as to match a desired transistor characteristic.

A layout of a conventional semiconductor circuit device and a transistor model used in a conventional design process of a semiconductor circuit device will be described below.

First, the layout of the semiconductor circuit device will be described by referring to an example of a cell layout shown in FIG. 7.

As shown in FIG. 7, a first PMIS transistor 120 formed on a semiconductor substrate (not shown) includes a first active region 101 and a first gate electrode 104 having a protruding portion 103 while a first NMIS transistor 121 includes a second active region 102 and a second gage electrode 105 having a protruding portion 103. The first gate electrode 104 and the second gate electrode 105 are connected to each other by means of a first gate wiring 106.

Similarly, a second PMIS transistor 130 includes a third active region 107 and a third gate electrode 109 having a protruding portion 103 while a second NMIS transistor 131 includes a fourth active region 108 and a fourth gage electrode 110 having a protruding portion 103. The third gate electrode 109 and the fourth gate electrode 110 are connected to each other by means of a second gate wiring 111.

Herein, the gate width $W_{p2}$ of the second PMIS transistor 130 is smaller than the gate width $W_{p1}$ of the first PMIS transistor 120. Similarly, the gate width $W_{n2}$ of the second NMIS transistor 131 is smaller than the gate width $W_{n1}$ of the first NMIS transistor 121. Also, the lengths E the protruding portions 103 of the gate electrodes of the respective transistors 120, 121, 130, 131 have the same length E. This is because: when the length E of each protruding portion 103 is set the shortest, capacitance caused between each gate electrode and the semiconductor substrate can be reduced with a result that propagation delay time of the cell can be shortened to the most unless the gate electrodes themselves are used as wirings for connection to another device.

Referring to a pair of the first PMIS transistor 120 and the first NMIS transistor 121 and a pair of the second PMIS transistor 130 and the second NMIS transistor 131, the gate widths $W_{p1}$, $Wp_{p2}$ of the PMIS transistors 120, 130 are greater than the gate widths $W_{n1}$, $W_{n2}$ of the NMIS transistors 121, 131, respectively. This arrangement is set on the basis that current drivability per unit gate width is lower in the PMIS transistor than in the NMIS transistor. With the gate width of the PMIS transistor greater than the gate width of the NMIS transistor, in a generally-called CMIS (complementary MIS) transistor composed of such a pair of the PMIS transistor and the NMIS transistor, when the potential level of an input signal is changed from HIGH to LOW, signal propagation time required for changing the level of an output signal from LOW to HIGH can be shortened more as the PMIS transistor has higher current drivability, resulting in realization of a higher performance semiconductor circuit device.

A transistor model used in the conventional semiconductor circuit design will be described next by referring to an example of a schematic view of FIG. 8.

FIG. 8 is a schematic view showing one example of a layout of a MIS transistor. As shown in FIG. 8, the MIS transistor is formed of an active region 112 and a gate electrode 113 arranged thereon. In a transistor model, a channel 114 of the MIS transistor is defined as an overlap region (a hatched part) of the active region 112 and the gate electrode 113.

In general, in the transistor model, the current drivability of the transistor is determined according to the width W and the length L of the channel 114, the resistance of the active region 112, and the resistance to be added to the active region 112 (not shown). Wherein, though information relating to a layout in the peripheral region of the transistor has not been taken into consideration conventionally, a transistor model using the lengths SA, SB of the active region as parameters has been developed for additionally reflecting characteristic variation caused due to STI (shallow trench isolation) stress (see Japanese Patent Application Laid Open Publication No. 2003-264242A, for example).

A netlist and a layout parameter extractor used in the conventional semiconductor circuit design will be described below with reference to FIG. 9 and FIG. 10.

FIG. 9 shows one example of a netlist for circuit simulation which indicates characteristic information and connection information of elements composing a semiconductor circuit device. In the netlist 140 shown in FIG. 9, each row beginning with "M" is description of a MIS transistor and indicates MIS transistor recognition information, terminal connection information of a drain, a gate, a source, and a substrate, a name of a MIS transistor model, a gate width, and a gate length in this order from the left. Wherein, each unit "u" at the gate width and the gate length is "μm."

FIG. 10 is a block diagram showing the conventional layout parameter extractor. As shown in FIG. 10, the layout parameter extractor 141 receives, as an input, mask layout data 143 of a semiconductor circuit device to be designed and extracts circuit connection information at a circuit element recognition section 142. Specifically, it recognizes a MIS transistor and outputs the terminal connection information and the transistor size of the thus recognized MIS transistor to the netlist 140.

However, in the conventional layout method as shown in FIG. 7 in which the gate widths of the PMIS transistors are set wider than those of the NMIS transistors for supplementing the current drivability of the PMIS transistors, the gate capacity increases as the current drivability of the PMIS transistor increases. This means that an effect of shortening the signal propagation time by the increase in current drivability cannot be expected necessarily.

SUMMARY OF THE INVENTION

The present invention has its objects of enhancing current drivability of a MIS transistor, especially, a PMIS transistor by solving the above conventional problems and changing (adjusting) a layout without changing a semiconductor process and of, in addition, obtaining simulation environment coping with the layout-changed semiconductor circuit device of the present invention.

To attain the above objects, a semiconductor circuit device of the present invention is structured as follows: in the case where a PMIS transistor and a NMIS transistor are included therein, the protruding length of a protruding portion of a gate electrode of the PMIS transistor is set longer; and in the case where MIS transistors having the same polarity are included therein, that of a MIS transistor having a smaller gate width is set longer.

Specifically, a first semiconductor circuit device of the present invention includes: a semiconductor substrate; a first PMIS transistor and a first NMIS transistor which are formed on the semiconductor substrate; and a first gate wiring for connecting the first PMIS transistor and the first NMIS transistor, wherein the first PMIS transistor includes a first active region which is formed on the semiconductor substrate and a first gate electrode which is formed on the first active region and which is connected at one end thereof to the first gate wiring and includes at the other end thereof a first protruding portion protruding at a side opposite to the first gate wiring side from the first active region, the first NMIS transistor includes a second active region which is formed on the semiconductor substrate with a space left from the first active region and a second gate electrode which is formed on the second active region and which is connected at one end thereof to the first gate wiring and includes at the other end thereof a second protruding portion protruding at a side opposite to the first gate wiring side from the second active region, and a protruding length of the first protruding portion of the first PMIS transistor is greater than a protruding length of the second protruding portion of the first NMIS transistor.

In the first semiconductor circuit device, it is preferable that the first protruding portion, the first gate electrode, the second protruding portion, the second gate electrode, and the first gate wiring are formed linearly.

Preferably, the first semiconductor circuit device further includes: a second PMIS transistor and a second NMIS transistor; and a second gate wiring for connecting the second PMIS transistor and the second NMIS transistor, wherein the second PMIS transistor includes a third active region which is formed on the semiconductor substrate and a third gate electrode which is formed on the third active region and which is connected at one end thereof to the second gate wiring and includes at the other end thereof a third protruding portion protruding at a side opposite to the second gate wiring side from the third active region, the second NMIS transistor includes a fourth active region which is formed on the semiconductor substrate with a space left from the third active region and a fourth gate electrode which is formed on the fourth active region and which is connected at one end thereof to the second gate wiring and includes at the other end thereof a fourth protruding portion protruding at a side opposite to the second gate wiring side from the fourth active region, and a gate width of the first PMIS transistor is smaller than a gate width of the second PMIS transistor, and the protruding length of the first protruding portion is greater than a protruding length of the third protruding portion.

In this case, preferably, the third protruding portion, the third gate electrode, the fourth protruding portion, the fourth gate electrode, and the second gate wiring are formed linearly.

Further, in this case, it is preferable that a gate width of the first NMIS transistor is smaller than a gate width of the second NMIS transistor, and the protruding length of the second protruding portion is greater than a protruding length of the fourth protruding portion.

Moreover, in this case, preferably, the space between the first active region and the second active region is equal in a gate width direction to the space between the third active region and the fourth active region.

Furthermore, in this case, preferably the protruding length of the third protruding portion is greater than a protruding length of the fourth protruding portion.

A second semiconductor circuit device of the present invention includes: a semiconductor substrate; and a first MIS transistor and a second MIS transistor which are formed on the semiconductor substrate and have the same polarity, and of which gate widths are different from each other, wherein the first MIS transistor includes a first active region which is formed on the semiconductor substrate and a first gate electrode which is formed on the first active region and which includes a first protruding portion protruding at one end thereof from the first active region, the second MIS transistor includes a second active region which is formed on the semiconductor substrate and a second gate electrode which is formed on the second active region and which includes a second protruding portion protruding at one end thereof from the second active region, and a gate width of the first MIS transistor is smaller than a gate width of the second MIS transistor, and a protruding length of the first protruding portion is greater than a protruding length of the second protruding portion.

In the second semiconductor circuit device, it is preferable that a sum of the gate width of the first MIS transistor and the protruding length of the first protruding portion is equal to a sum of the gate width of the second MIS transistor and the protruding length of the second protruding portion.

A first semiconductor circuit device simulation method, which is for simulating the first semiconductor circuit device of the present invention, includes the steps of: (a) generating an electric characteristic formula to which the protruding length of the first protruding portion of the first PMIS transistor and the protruding length of the second protruding portion of the first NMIS transistor are added as variables; (b) extracting the protruding length of the first protruding portion of the first PMIS transistor and the protruding length of the second protruding portion of the first NMIS transistor and adding the extracted lengths to a netlist in which an element characteristic and connection information are described; and (c) performing simulation of operation of the first PMIS transistor and the first NMIS transistor with the use of the electric characteristic formula to which the lengths as the variables are added and the netlist to which the extracted lengths are added.

A second semiconductor circuit device simulation method, which is for simulating the second semiconductor circuit device of the present invention, includes the steps of: (a) generating an electric characteristic formula to which the protruding length of the first protruding portion of the first MIS transistor and the protruding length of the second protruding portion of the second MIS transistor are added as variables; (b) extracting the protruding length of the first protruding portion of the first MIS transistor and the protruding length of the second protruding portion of the second MIS transistor and adding the extracted lengths to a netlist in which an element characteristic and connection information are described; and (c) performing simulation of operation of the first MIS transistor and the second MIS transistor with the use of the electric characteristic formula to which the protruding lengths as the variables are added and the netlist to which the extracted lengths are added.

A third semiconductor circuit device simulation method of the present invention includes the steps of: (a) generating an electric characteristic formula to which a protruding length of the protruding portion of the MIS transistor is added a variable; (b) extracting the protruding length of the protruding portion of the MIS transistor and adding the extracted length to a netlist in which an element characteristic and connection information are described; and (c) performing simulation of operation of the MIS transistor with the use of the electric characteristic formula to which the length as the variable is added and the netlist to which the extracted length is added.

As described above, the current drivability of the MIS transistor, especially the PMIS transistor is enhanced in the first or second semiconductor device of the present invention, achieving a higher performance semiconductor circuit device.

Further, the first to third semiconductor circuit device simulation methods of the present invention can realize simulation environment for the semiconductor circuit device of the present invention, attaining optimum design of the semiconductor circuit device of the present invention at high accuracy.

DESCRIPTION OF THE PREFERRED EMBODIMENTS (First Embodiment)

The first embodiment of the present invention will be described with reference to the drawings.

Figure 1:
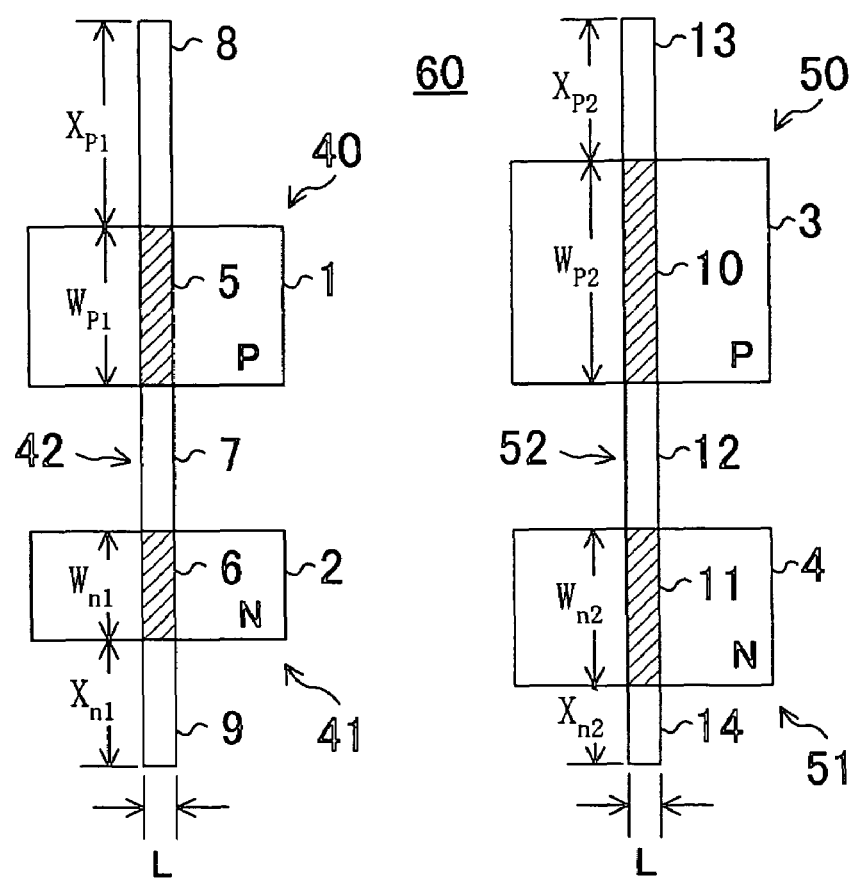
FIG. 1 is a plan view showing a layout of a semiconductor circuit device according to the first embodiment of the present invention.

FIG. 1 shows a layout of a semiconductor circuit device according to the first embodiment of the present invention. As shown in FIG. 1, a first active region 1 rectangular in plan serving as a first PMIS transistor 40 and a second active region 2 rectangular in plan serving as a first NMIS transistor 41 are formed on a semiconductor substrate (not shown) so as to be surrounded by an element isolation region 60 made of, for example, STI (Shallow Trench Isolation) in such a fashion that the sides of the active regions 1, 2 facing each other are in parallel to each other with a space left. Beside the first active region 1 and the second active region 2, a third active region 3 rectangular in plan serving as a second PMIS transistor 50 and a fourth active region 4 rectangular in plan serving as a second NMIS transistor 51 are surrounded by the element isolation region 60 in such a fashion that the sides of the active regions 3, 4 facing each other are in parallel to each other with a space left.

On the first active region 1 and the second active region 2, a first wiring pattern 42 having a width L is formed, which is made of, for example, conductive polysilicon to which an impurity is doped. Similarly, a second wring pattern 52 made of conductive polysilicon and having a width L is formed on the third active region 3 and the fourth active region 4.

The first wiring pattern 42 serves as a first gate electrode 5 on the first active region 1 and serves as a second gate electrode 6 on the second active region 2, wherein a part thereof between the first active region 1 and the second active region 2 serves as a first gate wiring 7. Further, the first wiring pattern 42 includes a first gate protruding portion 8 protruding at the side opposite to the second active region 2 side from the first active region 1 on the element isolation region 60 and a second gate protruding portion 9 protruding at the side opposite to the first active region 1 side from the second active region 2 on the element isolation region 60.

With the above structure, the first PMIS transistor 40 has a gate length L defined by the first gate electrode 5 and a gate width $W_{p1}$ defined by the first active region 1. Also, the first NMIS transistor 41 has a gate length L defined by the second gate electrode 6 and a gate width $W_{n1}$ defined by the second active region 2. Wherein, the gate width $W_{p1}$ is greater than the gate width $W_{n1}$.

Similarly, the second wiring pattern 52 serves as a third gate electrode 10 on the third active region 3 and serves as a fourth gate electrode 11 on the fourth active region 4, wherein a part thereof between the third active region 3 and the fourth active region 4 serves as a second gate wiring 12. Further, the second wiring pattern 52 includes a third gate protruding portion 13 protruding at the side opposite to the fourth active region 4 side from the third active region 3 on the element isolation region 60 and a fourth gate protruding portion 14 protruding at the side opposite to the third active region 3 side from the fourth active region 4 on the element isolation region 60.

With the above structure, the second PMIS transistor 50 has a gate length L defined by the third gate electrode 10 and a gate width $W_{p2}$ defined by the third active region 3. Also, the second NMIS transistor 51 has a gate length L defined by the fourth gate electrode 11 and a gate width $W_{n2}$ defined by the fourth active region 4. Wherein, the gate width $W_{p2}$ is greater than the gate width $W_{n2}$. Further, the gate width $W_{p2}$ of the second PMIS transistor 50 is greater than the gate width $W_{p1}$ of the first PMIS transistor 40, and the gate width $W_{n2}$ of the second NMIS transistor 51 is greater than the gate width $W_{n1}$ of the first NMIS transistor 41.

As shown in FIG. 1, one of significant features of the first embodiment lies in that the length $X_{p1}$ of the first gate protruding portion 8 of the first PMIS transistor 40 is greater than the length $X_{n1}$ of the second gate protruding portion 9 of the first NMIS transistor 41.

Similarly, the length $X_{p2}$ of the third gate protruding portion 13 of the second PMIS transistor 50 is greater than the length $X_{n2}$ of the fourth gate protruding portion 14 of the second NMIS transistor 51.

Further, the length $X_{p1}$ of the first gate protruding portion 8 of the first PMIS transistor 40, which has the gate width $W_{p1}$ smaller than the gate width $W_{p2}$ of the second PMIS transistor 50, is greater than the length $X_{p2}$ of the third gate protruding portion 13 of the second PMIS transistor 50.

Similarly, the length $X_{n1}$ of the second gate protruding portion 9 of the first NMIS transistor 41, which has the gate width $W_{n1}$ smaller than the gate width $W_{n2}$ of the second NMIS transistor 51, is greater than the length $X_{n2}$ of the fourth gate protruding portion 14 of the second NMIS transistor 51.

Herein, in the first embodiment, the lengths of the first wiring pattern 42 and the second wiring pattern 52 are set equal to each other, and the lengths of the first gate wiring 7 and the second gate wiring 12 are set equal to each other. The height (herein, each length in the extending direction of the wiring patterns 42, 52) of cells composing a LSI circuit is restricted in general. Accordingly, when the gate width Wpi of the first PMIS transistor 40 and the gate width $W_{n1}$ of the first NMIS transistor 41 are set smaller than the gate width $W_{p2}$ of the second PMIS transistor 50 and the gate width $W_{n2}$ of the second NMIS transistor 51, respectively, as described above, the lengths of the gate protruding portions are greater as the gate widths are smaller.

In the first embodiment, the length $X_{p1}$ of the first gate protruding portion 8 of the first PMIS transistor 40, of which current drivability is lower than that of the first NMIS transistor 41, is set greater than the length $X_{n1}$ of the second gate protruding portion 9 of the first NMIS transistor 41, and the length $X_{p2}$ of the third gate protruding portion 13 of the second PMIS transistor 50, of which current drivability is lower than that of the second NMIS transistor 51, is set greater than the length $X_{n2}$ of the fourth gate protruding portion 14 of the second NMIS transistor 51. Accordingly, the current drivability of each PMIS transistor 40, 50 is enhanced, attaining a higher performance semiconductor circuit device.

As well, when the length of the gate protruding portion is set greater in a MIS transistor having a smaller gate width to enhance the drivability thereof, a further higher performance semiconductor circuit device can be attained.

Figure 2A:
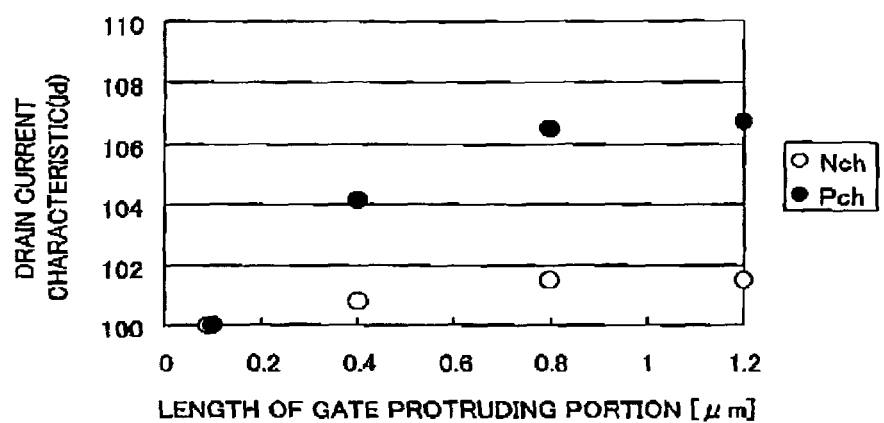
FIG. 2A is a graph showing length dependency of a gate protruding portion on a drain current characteristic of a MIS transistor in the semiconductor circuit device according to the first embodiment of the present invention.

FIG. 2A shows length dependency of a gate protruding portion on a drain current characteristic of a MIS transistor. In FIG. 2A, the axis of abscissas indicates the length of the gate protruding portion (unit: μm) while the axis of ordinates indicates variation amount of the drain current characteristic where a reference length of the gate protruding portion is set to 100.

Figure 2B:
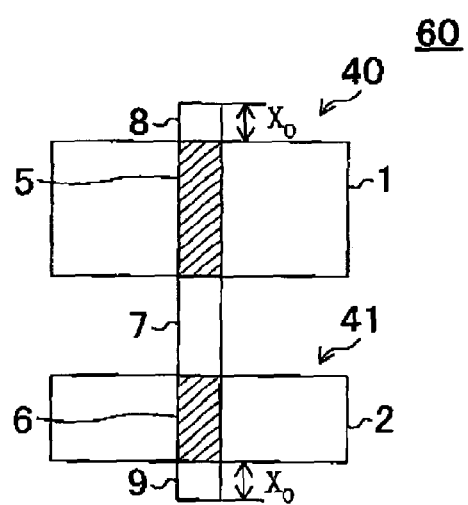
FIG. 2B is a plan view showing a layout of a semiconductor circuit device where each length of gate protruding portions in FIG. 2A is set to a reference value.
Figure 2C:
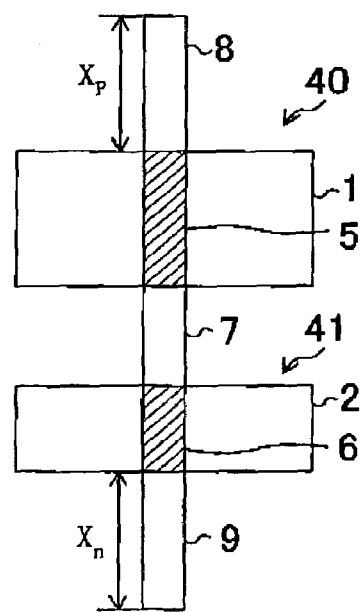
FIG. 2C is a plan view showing a layout of a semiconductor circuit device of which gate protruding portions are changed in length.

FIG. 2B shows a layout of a semiconductor circuit device where the length of each gate protruding portion 8, 9 is set to a reference value $X_0$, and FIG. 2C shows a layout of a semiconductor circuit device where the gate lengths of the gate protruding portions 8, 9 are set to $X_p$ and $X_n$ (wherein, $X_p = X_n > X_0$), respectively. Herein, in FIG. 2B and FIG. 2C, the same reference numerals are assigned to the same elements as those in FIG. 1. FIG. 2A proves that the current drivability of the PMIS transistor 40 indicated by black circles is enhanced more remarkably compared with that of the NMIS transistor 41 indicated by white circles as the lengths $X_p$, $X_n$ of the gate protruding portions becomes greater.

This is because: through not shown, insulting films called sidewall films of, for example, silicon nitride (SiN) films are formed on the respective side faces of the gate electrodes 5, 6 including the gate protruding portions 8, 9 in general; the SiN films exhibit a contraction effect (contraction stress) to reduce compression stress in the widthwise redirection of the gates, which is applied to the lower parts of the gate electrodes 5, 6 at the end parts of the active regions 1, 2; accordingly, the compression stress is reduced more as the lengths of the gate protruding portions 8, 9 of the MIS transistors become greater. Thus, the reduction in compression stress enhances the current drivability of the PMIS transistor 40.

The current drivability of the NMIS transistor 41 is enhanced as well, of which variation amount is smaller than that of the PMIS transistor though. This is because the drivability of the NMIS transistor is lowered to the contrary when the compression stress applied downwards to the gate electrode 6 is reduced by the contraction effect of the SiN film as the sidewall film of the gate electrode 6. As a result, the contraction effect of the SiN film is cancelled by the lowering in current drivability, so that less increase in drain current is observed compared with in the PMIS transistor.

As described above, in the layout of the MIS transistors composing the semiconductor circuit device, especially of the PMIS transistor, the current drivability can be enhanced by increasing the length $X_p$ of the gate protruding portion 8 from the gate electrode 5. Wherein, the gate protruding portion 8 having the increased length $X_p$ increases parasitic capacitance between the gate electrode 5 and the semiconductor substrate. However, since the element isolation region 60 made of a comparatively thick oxide film is laid below the gate protruding portion 8, the influence of the increase in parasitic capacitance is ignorable. Therefore, delay in signal propagation time can be suppressed by the increase in drivability of the MIS transistors, attaining a high performance semiconductor circuit device.

(Second Embodiment)

The second embodiment of the present invention will be described below.

In the second embodiment, circuit simulation environment for the semiconductor circuit device of the present invention will be described with reference to the drawings. Herein, a MIS transistor model necessary for circuit simulation, a method for extracting a parameter thereof, and netlist that describes circuit information will be described.

The circuit simulation environment will be described first. Variation in characteristic of the MIS transistors according to the lengths of the gate protruding portions is as shown in FIG. 2A. When the characteristic variation is modelized as a current characteristic formula using the length of the gate protruding portion as a variable and is incorporated into a MIS transistor model, simulation of the electric characteristic of the MIS transistors having the length of the gate protruding portion as the variable can be enabled.

Each protruding amount of the gate protruding portions of the MIS transistors is extracted from a mask layout data for a semiconductor circuit device by judging whether or not each pattern in mask layout data for the semiconductor circuit device is a gate wiring formed on the element isolation region and is connected to only one MIS transistor, so that information reflecting the extracted values can be output to the netlist.

Combination of the MIS transistor model and the netlist enables, through circuit simulation of the semiconductor circuit device, design of a highly accurate semiconductor circuit device that takes in consideration the length of the protruding portion of the gate electrode.

The following formula (1) is an electric characteristic formula expressing a drain current of the MIS transistor model according to the present invention.

$$I_d = f(V_d, V_g, V_s, V_b, L, W, E) \quad (1)$$

Wherein, $V_d$ denotes a drain voltage, $V_g$ denotes a gate voltage, $V_s$ denotes a source voltage, $V_b$ denotes a substrate voltage, L denotes a gate length, W denotes a gate width, and E denotes a length of the gate protruding portion. In this way, in the semiconductor circuit device simulation method according to the second embodiment, the amount of the drain current is changed by adding the length E of the gate protruding portion to the variables of the electric characteristic formula, thereby expressing the length dependency of the gate protruding portion on the drain current characteristic of the MIS transistor.

Figure 3A:
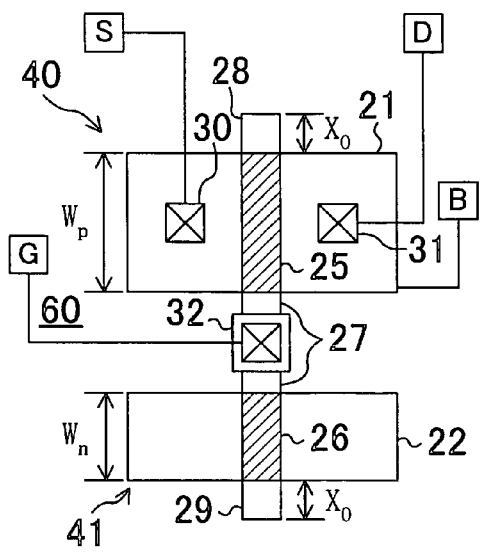
FIG. 3A and FIG. 3B are plan views each showing one example of a layout pattern for extracting a model parameter in a MIS transistor model used in a semiconductor circuit device simulation method according to the second embodiment of the present invention.
Figure 3B:
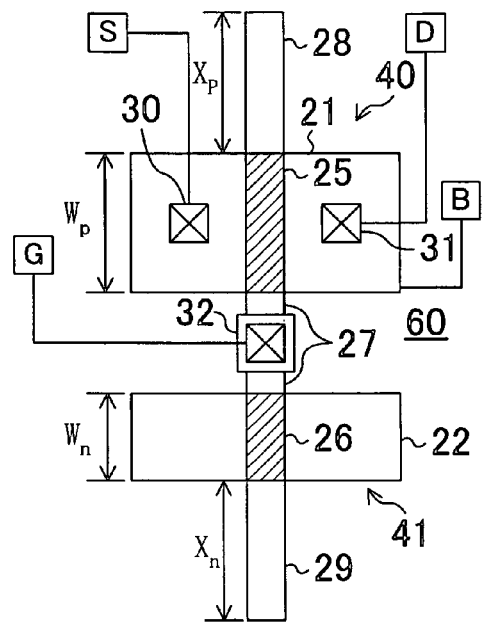

FIG. 3A and FIG. 3B show examples of layout patterns for extracting a model parameter in the MIS transistor model according to the second embodiment of the present invention. In FIG. 3A and FIG. 3B, a PMIS transistor 40 includes a first active region 21 and a first gate electrode 25, and a source contact 30 and a drain contact 31 are formed at parts on the respective sides of the first gate electrode 25 on the first active region 21.

A NMIS transistor 41 includes a second active region 22 and a second gate electrode 26, and the first gate electrode 25 and the second gate electrode 26 are electrically connected to each other by means of a gate wiring 27. A gate contact 32 is formed at the central part of the gate wiring 27. Further, the source contact 30 is connected to a source terminal S through a first upper layer wiring, the drain contact 31 is connected to a drain terminal D through a second upper wiring, and the gate contact 32 is connected to a gate terminal G through a third upper wiring. The first active region 21 is connected to a substrate terminal B.

Difference between FIG. 3A and FIG. 3B lies in that the length $X_p$ of a first gate protruding portion 28 protruding from the first gate electrode 25 and the length $X_n$ of a second protruding portion 29 protruding from the second gate electrode 26 in FIG. 3B are greater than the length $X_0$ of the first protruding portion 28 and the length $X_0$ of the second gate protruding portion 29 in FIG. 3A, respectively.

Figure 3C:
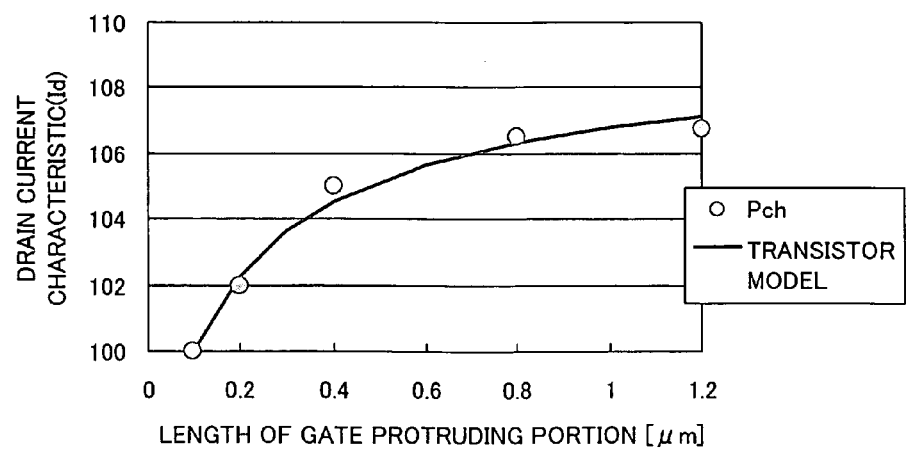
FIG. 3C is a graph showing a characteristic of the transistor model obtained from FIG. 3A and FIG. 3B.

For example, measurement of an electric characteristic of a PMIS transistor is necessary for extracting a parameter for the PMIS transistor model. The electric characteristic of the PMIS transistor 40 with the length $X_p$ of the first gate protruding portion 28 as a variable can be measured from the two patterns for transistor model parameter extraction shown in FIG. 3A and FIG. 3B. FIG. 3C shows a result of parameter extraction using the layout patterns for of PMIS transistor model parameter extraction, wherein the solid line indicates the electric characteristic of the PMIS transistor.

In FIG. 3C, the layout pattern of which the value of the drain current Id is 100, the reference value, corresponds to FIG. 3A, and the four plots indicate the results of measurement with the length $X_p$ of the first gate protruding portion 28 changed to four in the layout pattern shown in FIG. 3B.

It is noted that the second embodiment mentions the pattern examples for measuring a characteristic of the PMIS transistor but a NMIS transistor model parameter can be extracted in the NMIS transistor 41 as well if model parameter extraction patterns of the NMIS transistor 41 are formed by providing each of the contacts and the upper layer wirings.

As described above, when an electric characteristic expressed with the use of the length of the gate protruding portion of a MIS transistor as a variable E is measured from measurable patterns and the electric characteristic of the MIS transistor model according to the second embodiment is applied (incorporated) to the measurement result of the electric characteristic obtained in the process thereafter, the length dependency of the gate electrode can be provided to the MIS transistor model.

Figures 4, 5:
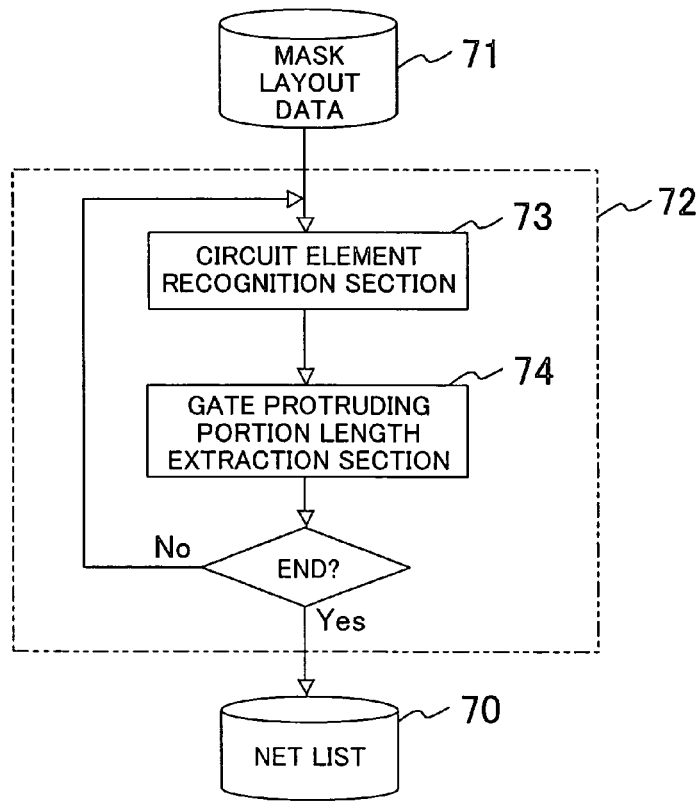
FIG. 4 shows a netlist used in the semiconductor circuit device simulation method according to the second embodiment of the present invention.
FIG. 5 is a block diagram showing a circuit information extractor for realizing the semiconductor circuit device simulation method according to the second embodiment of the present invention.

FIG. 4 shows one example of a netlist for circuit simulation which indicates characteristic information and connection information of each element composing the semiconductor circuit device according to the second embodiment of the present invention.

In the netlist 70 shown in FIG. 4, each row beginning with "M" is description of a MIS transistor and indicates MIS transistor recognition information, terminal connection information of a drain, a gate, a source, and a substrate, a name of a MIS transistor model, a gate width, a gate length, and a length of a gate protruding portion in this order from the left. Wherein, each unit "u" at the gate width, the gate length, and the length of the gate protruding portion is "µm."

With the netlist shown in FIG. 4, the length of a gate protruding portion of a gate electrode can be provided as a variable to a MIS transistor model indicated as the formula (1).

As described above, with the MIS transistor model and the netlist, both of which take in consideration the length of the gate protruding portion of the gate electrode, highly accurate circuit simulation taking in consideration the protruding length of the gate electrode can be realized.

FIG. 5 is a block diagram showing a circuit information extractor according to the second embodiment of the present invention. As shown in FIG. 5, the circuit information extractor 72 of the second embodiment receives, as an input, mask layout data 71 for a semiconductor circuit device and recognizes a MIS transistor at a circuit element recognition section 73. Then, a gate protruding portion length extraction section 74 judges whether each gate wiring pattern arranged on an element isolation region is a gate protruding portion or a gate wiring and calculates the protruding length of each gate wiring pattern judged as a gate protruding portion. Subsequently, the terminal connection information and the transistor size of each MIS transistor recognized at the circuit element recognition section 73 and the protruding length of each gate electrode extracted at the gate protruding portion length extraction section 74 are output to the netlist 70 shown in FIG. 4.

As described above, through the circuit information extractor 72 of the second embodiment, the netlist 70 to which the length of the gate protruding portion of the wiring pattern of each MIS transistor is added can be obtained from the mask layout data 71 for the semiconductor circuit device automatically.

It is noted that a known LPE (layout parameter extractor) can be employed as the circuit element recognition section 73. Wherein, the circuit element recognition section 73 may not be necessarily needed in the case where data amount of the mask layout data 71 is less.

Further, as described in the first embodiment with reference to FIG. 1, when the first wiring pattern 42 and the first gate wiring 7 are restricted to have predetermined lengths with respect to the first PMIS transistor 40 and the first NMIS transistor 41, for example, the length $X_{p1}$ of the first gate protruding portion 8 and the length $X_{n1}$ of the second gate protruding portion 9 are longer necessarily as the gate width $W_{p1}$ of the first PMIS transistor 40 and the gate width $W_{n1}$ of the first NMIS transistor 41 are shorter. This means that the smaller the gate widths of MIS transistors are, the greater the lengths $X_{p1}$, $X_{n1}$ of the gate protruding portions 8, 9 are, readily achieving a higher performance semiconductor circuit device.

Figure 6:
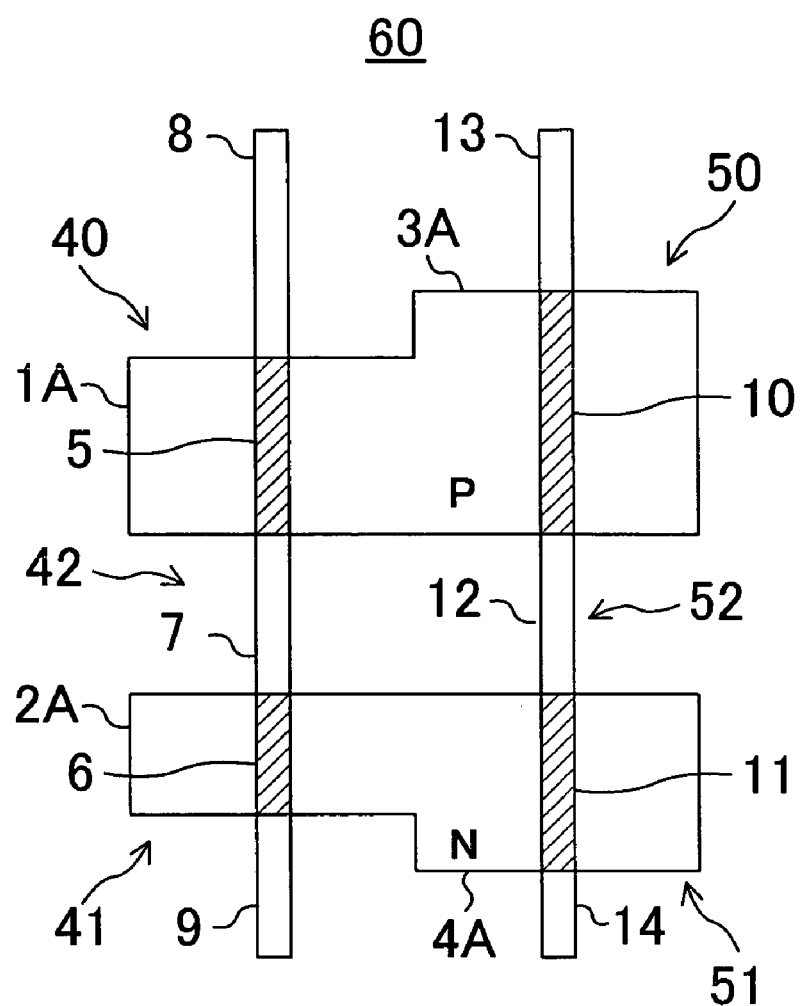
FIG. 6 is a plan view showing one modified example of a layout of a semiconductor circuit device used in the semiconductor circuit device simulation method according to the second embodiment of the present invention.
Figure 7:
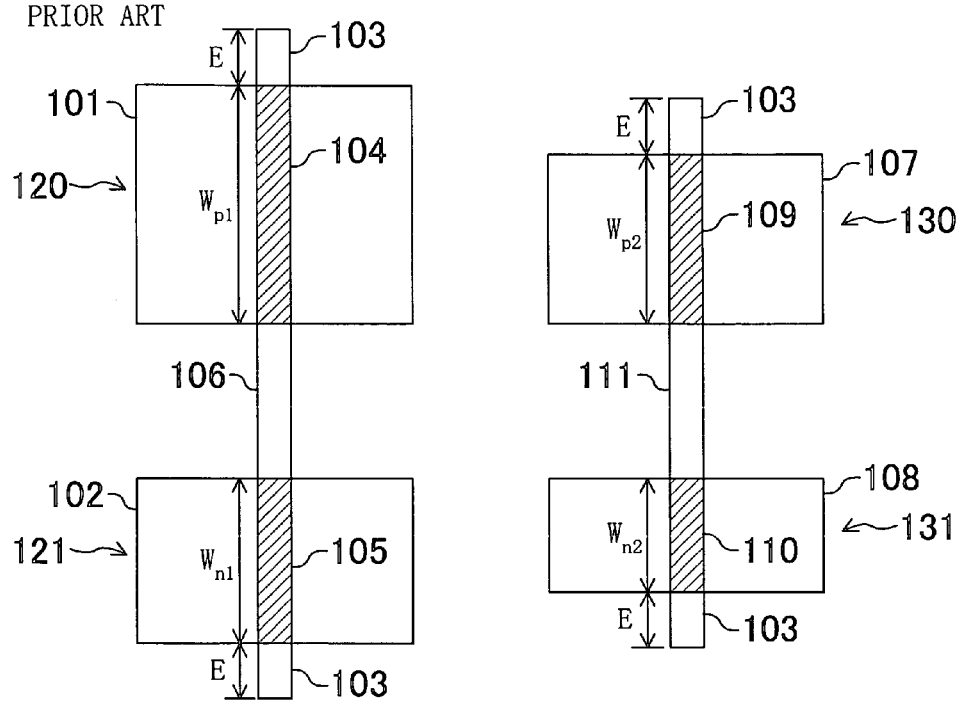
FIG. 7 is a plan view showing one example of a layout of a semiconductor circuit device according to a conventional example.
Figure 8:
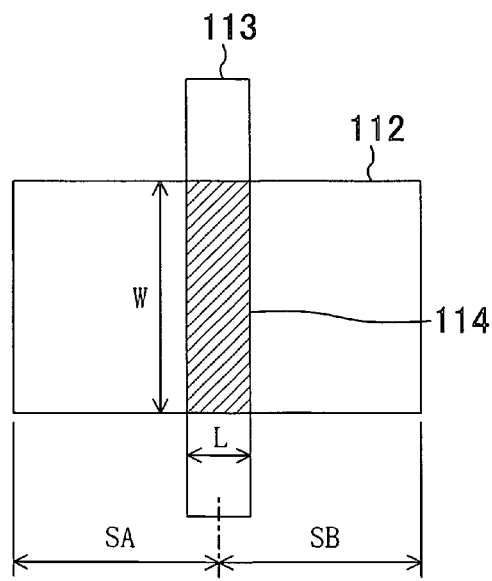
FIG. 8 is a schematic plan view showing one example of a layout of a MIS transistor according to another conventional example.
Figure 9:
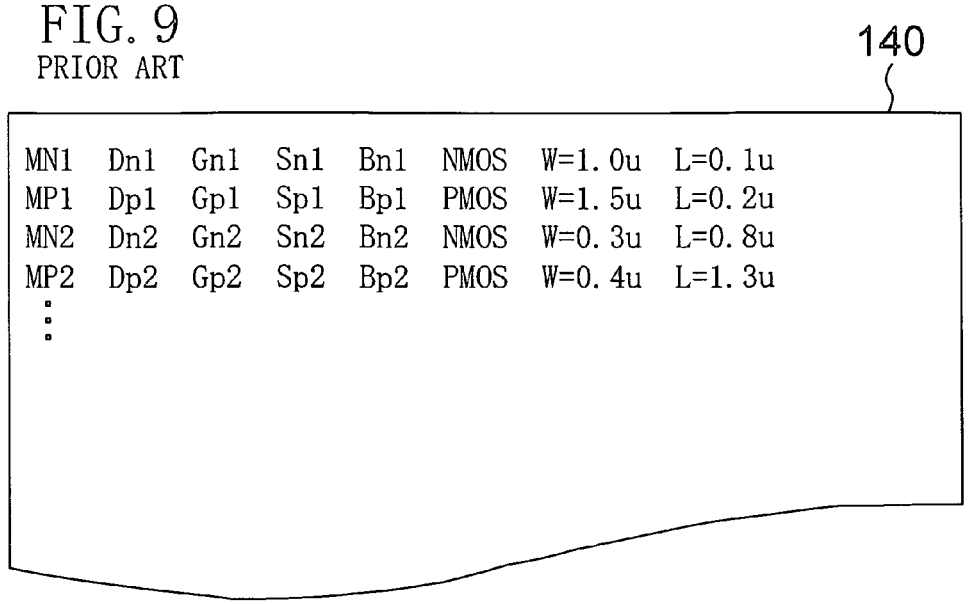
FIG. 9 shows a netlist used in a semiconductor circuit device simulation method according to still another conventional example.
Figure 10:
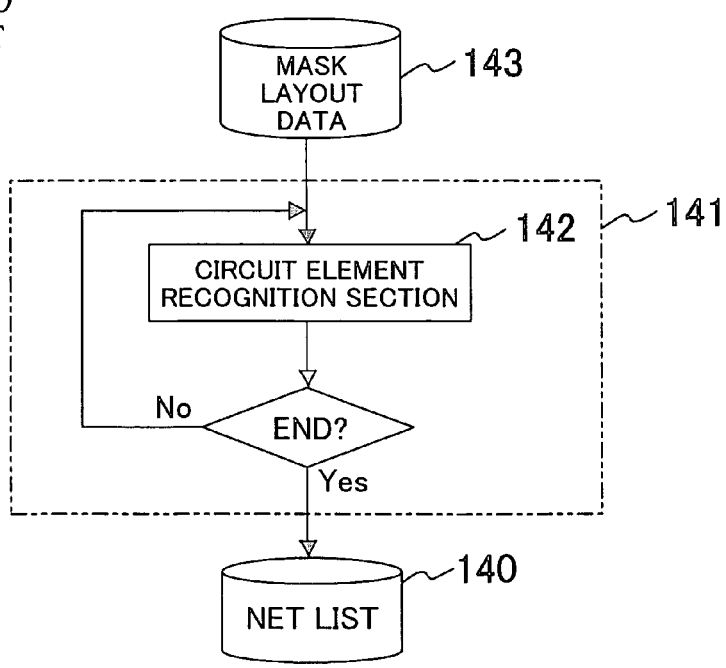
FIG. 10 is a block diagram showing a layout parameter extractor according to yet another conventional example.

Moreover, as shown in FIG. 6, the present invention can be applied to a layout in which a first PMIS transistor 40 and a second PMIS transistor 50 share active regions 1A, 3A which are not separated by the element isolation region while the first NMIS transistor 50 and the second NMIS transistor 51 share active regions 2A, 4A as well.

Furthermore, though active regions for a power source contact and a substrate contact of each MIS transistor are not explicitly indicated in the first and second embodiments, the effects of the present invention can be obtained in the case where the wiring patterns 42, 52 are arranged long up to the active region for the substrate contact or beyond the active region for the substrate contact only if elements around each MIS transistor receives no influence.

(Third Embodiment)

The third embodiment of the present invention will be described below.

In the first and second embodiments, the gate width W and the length E of the gate protruding portion are used as independent parameters (variables) in a transistor model for a MIS transistor. In the third embodiment, the length E of the gate protruding portion is made dependent on the gate width W. Specifically, when only the polarity and the gate width of a to-be-simulated MIS transistor are determined, the length of the gate protruding portion is necessarily determined on the basis of the fact that the length of the gate protruding portion is determined necessarily according to the polarity and the gate width of a MIS transistor. Accordingly, with the polarity and the gate width of a MIS transistor, the electric characteristic of the MIS transistor can be determined necessarily.

From the foregoing, when a pattern having the same rule as that of a semiconductor circuit device is prepared as a transistor set for extracting a MIS transistor model parameter and a model parameter of the MIS transistor is extracted from the transistor set, the electric characteristic of the MIS transistor that takes in consideration the length of the gate protruding portion can be simulated automatically through an existing MIS transistor model formula. Hence, a highly accurate semiconductor circuit device can be designed in existing circuit simulation environment.

As described above, in the third embodiment, a conventional MIS transistor model can be used as the MIS transistor model, and a conventional netlist can be used as the netlist.

Thus, the semiconductor circuit device according to the present invention is enhanced in current drivability of the MIS transistor, especially, of the PMIS transistor, thereby attaining a higher performance semiconductor circuit device. Also, the simulation method according to the present invention can realize simulation environment for the semiconductor circuit device of the present invention. Thus, the present invention is useful as a semiconductor circuit device, a simulation method thereof, and the like which can optimize design layout.

What is claimed is:

1. A semiconductor circuit device comprising:
a semiconductor substrate;
a first PMIS transistor and a first NMIS transistor which are formed on the semiconductor substrate; and
a first gate wiring for connecting the first PMIS transistor and the first NMIS transistor,
wherein the first PMIS transistor includes a first active region which is formed on the semiconductor substrate and a first gate electrode which is formed on the first active region and which is connected at one end thereof to the first gate wiring and includes at the other end thereof a first protruding portion protruding at a side opposite to the first gate wiring side from the first active region,
the first NMIS transistor includes a second active region which is formed on the semiconductor substrate with a space left from the first active region and a second gate electrode which is formed on the second active region and which is connected at one end thereof to the first gate wiring and includes at the other end thereof a second protruding portion protruding at a side opposite to the first gate wiring side from the second active region, and
a protruding length of the first protruding portion of the first PMIS transistor is greater than a protruding length of the second protruding portion of the first NMIS transistor.

2. The semiconductor circuit device of claim 1, wherein the first protruding portion, the first gate electrode, the second protruding portion, the second gate electrode, and the first gate wiring are formed linearly.

3. The semiconductor circuit device of claim 1, further comprising:
a second PMIS transistor and a second NMIS transistor; and
a second gate wiring for connecting the second PMIS transistor and the second NMIS transistor,
wherein the second PMIS transistor includes a third active region which is formed on the semiconductor substrate and a third gate electrode which is formed on the third active region and which is connected at one end thereof to the second gate wiring and includes at the other end thereof a third protruding portion protruding at a side opposite to the second gate wiring side from the third active region,
the second NMIS transistor includes a fourth active region which is formed on the semiconductor substrate with a space left from the third active region and a fourth gate electrode which is formed on the fourth active region and which is connected at one end thereof to the second gate wiring and includes at the other end thereof a fourth protruding portion protruding at a side opposite to the second gate wiring side from the fourth active region, and a gate width of the first PMIS transistor is smaller than a gate width of the second PMIS transistor, and the protruding length of the first protruding portion is greater than a protruding length of the third protruding portion.

4. The semiconductor circuit device of claim 3, wherein the third protruding portion, the third gate electrode, the fourth protruding portion, the fourth gate electrode, and the second gate wiring are formed linearly.

5. The semiconductor circuit device of claim 3, wherein a gate width of the first NMIS transistor is smaller than a gate width of the second NMIS transistor, and the protruding length of the second protruding portion is greater than a protruding length of the fourth protruding portion.

6. The semiconductor circuit device of claim 3, wherein the space between the first active region and the second active region is equal in a gate width direction to the space between the third active region and the fourth active region.

7. The semiconductor circuit device of claim 3 wherein the protruding length of the third protruding portion is greater than a protruding length of the fourth protruding portion.

8. A semiconductor circuit device comprising:
a semiconductor substrate; and
a first MIS transistor and a second MIS transistor which are formed on the semiconductor substrate and have the same polarity, and of which gate widths are different from each other,
wherein the first MIS transistor includes a first active region which is formed on the semiconductor substrate and a first gate electrode which is formed on the first active region and which includes a first protruding portion protruding at one end thereof from the first active region,
the second MIS transistor includes a second active region which is formed on the semiconductor substrate and a second gate electrode which is formed on the second active region and which includes a second protruding portion protruding at one end thereof from the second active region, and
a gate width of the first MIS transistor is smaller than a gate width of the second MIS transistor, and a protruding length of the first protruding portion is greater than a protruding length of the second protruding portion.

9. The semiconductor circuit device of claim 8, wherein a sum of the gate width of the first MIS transistor and the protruding length of the first protruding portion is equal to a sum of the gate width of the second MIS transistor and the protruding length of the second protruding portion.

10. A semiconductor circuit device simulation method for simulating a semiconductor circuit device which includes:
a semiconductor substrate;
a first PMIS transistor and a first NMIS transistor which are formed on the semiconductor substrate; and
a first gate wiring for connecting the first PMIS transistor and the first NMIS transistor,
the first PMIS transistor including a first active region which is formed on the semiconductor substrate and a first gate electrode which is formed on the first active region and which is connected at one end thereof to the first gate wiring and includes at the other end thereof a first protruding portion protruding at a side opposite to the first gate wiring side from the first active region, the first NMIS transistor including a second active region which is formed on the semiconductor substrate with a space left from the first active region and a second gate electrode which is formed on the second active region and which is connected at one end thereof to the first gate wiring and includes at the other end thereof a second protruding portion protruding at a side opposite to the first gate wiring side from the second active region, and a protruding length of the first protruding portion of the first PMIS transistor being greater than a protruding length of the second protruding portion of the first NMIS transistor, the method comprising the steps of:
(a) generating an electric characteristic formula to which the protruding length of the first protruding portion of the first PMIS transistor and the protruding length of the second protruding portion of the first NMIS transistor are added as variables;
(b) extracting the protruding length of the first protruding portion of the first PMIS transistor and the protruding length of the second protruding portion of the first NMIS transistor and adding the extracted lengths to a netlist in which an element characteristic and connection information are described; and
(c) performing simulation of operation of the first PMIS transistor and the first NMIS transistor with the use of the electric characteristic formula to which the lengths as the variables are added and the netlist to which the extracted lengths are added.

11. A semiconductor circuit device simulation method for simulating a semiconductor circuit device which includes:
a semiconductor substrate; and
a first MIS transistor and a second MIS transistor which are formed on the semiconductor substrate and have the same polarity, and of which gate widths are different from each other,
the first MIS transistor including a first active region which is formed on the semiconductor substrate and a first gate electrode which is formed on the first active region and which includes a first protruding portion protruding at one end thereof from the first active region,
the second MIS transistor including a second active region which is formed on the semiconductor substrate and a second gate electrode which is formed on the second active region and which includes a second protruding portion protruding at one end thereof from the second active region, and
a gate width of the first MIS transistor being smaller than a gate width of the second MIS transistor, and a protruding length of the first protruding portion being greater than a protruding length of the second protruding portion, the method comprising the steps of:
(a) generating an electric characteristic formula to which the protruding length of the first protruding portion of the first MIS transistor and the protruding length of the second protruding portion of the second MIS transistor are added as variables;
(b) extracting the protruding length of the first protruding portion of the first MIS transistor and the protruding length of the second protruding portion of the second MIS transistor and adding the extracted lengths to a netlist in which an element characteristic and connection information are described; and (c) performing simulation of operation of the first MIS transistor and the second MIS transistor with the use of the electric characteristic formula to which the protruding lengths as the variables are added and the netlist to which the extracted lengths are added.

12. A semiconductor circuit device simulation method for simulating a semiconductor circuit device which includes an active region and a MIS transistor which is formed on the active region and in which a gate electrode having a protruding portion protruding from one side of the active region is formed, the method comprising the steps of:

(a) generating an electric characteristic formula to which a protruding length of the protruding portion of the MIS transistor is added a variable;

(b) extracting the protruding length of the protruding portion of the MIS transistor and adding the extracted length to a netlist in which an element characteristic and connection information are described; and (c) performing simulation of operation of the MIS transistor with the use of the electric characteristic formula to which the length as the variable is added and the netlist to which the extracted length is added.

\* \* \* \* \*